(12) United States Patent
Sharp et al.

(10) Patent No.: US 6,366,131 B1
(45) Date of Patent: Apr. 2, 2002

(54) SYSTEM AND METHOD FOR INCREASING A DRIVE SIGNAL AND DECREASING A PIN COUNT

(75) Inventors: Nolan D. Sharp, Santa Clara; Sebastian Turullois, Cupertino, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/561,726

(22) Filed: May 1, 2000

(51) Int. Cl.$^7$ ............................................ H01L 25/00
(52) U.S. Cl. ............................ 326/101; 326/86; 326/82
(58) Field of Search ................................ 326/26, 27, 82, 326/83, 86, 101

(56) References Cited

U.S. PATENT DOCUMENTS

| | | |
|---|---|---|
| 4,625,127 A | 11/1986 | Lee et al. |
| 5,122,684 A | 6/1992 | Takeshian |
| 5,517,055 A | 5/1996 | Pasch |
| 5,572,064 A | 11/1996 | Pasch |
| 5,696,403 A | 12/1997 | Rostoker et al. |
| 5,761,246 A * | 6/1998 | Cao et al. .................... 375/287 |
| 5,808,366 A | 9/1998 | Song |
| 5,864,584 A * | 1/1999 | Cao et al. .................... 375/244 |
| 6,006,023 A | 12/1999 | Higashida |
| 6,028,986 A | 2/2000 | Song |

\* cited by examiner

*Primary Examiner*—Michael Tokar
*Assistant Examiner*—Anh Tran

(57) ABSTRACT

The present invention is a system and method for providing a signal to a load. A first driver receives a first input signal from within the integrated circuit and provides a first output signal at an output. A second driver receives a second signal from within the integrated circuit and provides a second output signal at an output. An electrically coupling device couples the first and second signals at the outputs of the first and second drivers to produce a combined driver signal. The electrically coupling device provides the combined driver signal to a load.

13 Claims, 3 Drawing Sheets

SYSTEM AND METHOD FOR INCREASING A DRIVE SIGNAL AND DECREASING A PIN COUNT

THE FIELD OF THE INVENTION

The present invention relates to semiconductor integrated circuits, and more particularly, to an interconnection design between a driver and a load which increases a drive signal and decreases a pin count of an integrated circuit.

BACKGROUND OF THE INVENTION

The sophistication of a present-day electronic system is the result of the complex functions handled by integrated circuits making up the electronic system. Within a single silicon chip or wafer, numerous integrated circuits are fabricated. Each integrated circuit may comprise many millions of transistors, including associated diodes, resistors, and capacitors, interconnected to form complex electronic systems capable of performing various functions. The integrated circuit, also known as a die, is secured in an encapsulating package having leads, also known as pins, for connecting the integrated circuit to the overall electronic system or product incorporating numerous integrated circuits via a printed circuit board.

Semiconductor integrated circuits comprise the majority of electronic circuits in computers and other digital electronic products. Integrated circuits can be configured, for example, as a central processing unit (CPU), a programmable logic array (PLA), an application specific integrated circuit (ASIC), or a digital signal processor (DSP). Both the sophistication and speed of operation of these integrated circuits has rapidly increased due to improvements in integrated circuit manufacturing technologies resulting in smaller and faster devices.

Within an integrated circuit, numerous drivers are fabricated adjacent to die pins associated with the outputs of the integrated circuit. The numerous drivers each drive a signal from within the integrated circuit to other integrated circuits or components of the overall electronic system. A driver is a known device in integrated circuit technology. A driver normally consists of a transistor design capable of receiving an input signal, manipulating the signal in one of a variety of ways, such as amplifying the signal, and providing an output signal. In prior integrated circuit designs, each driver and associated die pin is electrically coupled to a printed circuit board pin through an encapsulating package. The package provides both protection for the fragile, silicon integrated circuit and a connection between the integrated circuit and the printed circuit board. The printed circuit board facilitates interconnection between the integrated circuit and other integrated circuits or electrical components within a particular system through board traces or other electrical connections.

In prior integrated circuit designs, each driver and associated die pin is electrically connected to one or more printed circuit board pins, which in turn is connected to one or more loads in the form of integrated circuits or electrical components. If a single die pin and associated drive is connected to more than one printed circuit board pin, a fanout design, as is known in the art, is employed. A fanout design transmits a signal from a single driver to multiple loads (integrated circuits or electrical components).

The speed and frequency of digital electronic products and computers are constantly increasing. With this increasing speed, it is becoming ever difficult to provide an integrated circuit having drivers capable of driving signals to one or more loads, such as other integrated circuits or electrical components within the system, at elevated frequencies. In addition, due to the increased number of integrated circuits and other components which can be included on a single printed circuit board, the number of printed circuit board pins is insufficient for interconnection. Thus, there is a need for an integrated circuit design which will provide an increased drive signal between one or more integrated circuits at elevated frequencies utilizing a minimal number of printed circuit board pins.

SUMMARY OF THE INVENTION

The present invention is a system and method for providing a signal to a load. The invention provides increased signal flow to a load, while reducing the number of printed circuit board pins used to transmit the increased signal to the load. In one embodiment, the integrated circuit receives power from an external source. A first driver is electrically coupled to the power source such that the power source provides power to the first driver. The first driver receives a first input signal from within the integrated circuit and provides a first output signal at an output. A second driver is electrically coupled to the power source such that the power source provides power to the second driver. The second driver receives a second input signal from within the integrated circuit and provides a second output signal at an output. An electrically coupling device couples the first and second signals at the outputs of the first and second drivers to produce a combined signal. The electrically coupling device provides the combined signal to a load.

The combined signal provided to the load by the electrically coupling device provides an increased drive signal to the load. Therefore, while any one signal is not propagating at a faster rate, multiple signals are transmitted to the load in the same amount of time as a single signal previously reached the load, such that the strength of the overall drive signal received by the load is increased. In addition, the pin count for the associated printed circuit board is decreased since two or more driver signals are supplied to a single pin.

In one embodiment, the output of at least two drivers are electrically coupled and the single combined signal is connected to a load via a single printed circuit board pin. In another embodiment, a plurality of pairs of outputs of drivers are electrically coupled and provided to various loads, thereby further increasing the driver signal and decreasing the printed circuit board pin count while supplying increased drive signals to multiple loads. In yet another embodiment, each electrically coupling device is a conductor, such as a wire. The interconnection of numerous driver outputs further reduces the printed circuit board pin count, while providing an increased drive signal to the load. In yet still another embodiment, a single conductor electrically couples the combined signal to a plurality of loads. Numerous jumper conductors permit the combined signal to propagate to the plurality of loads.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
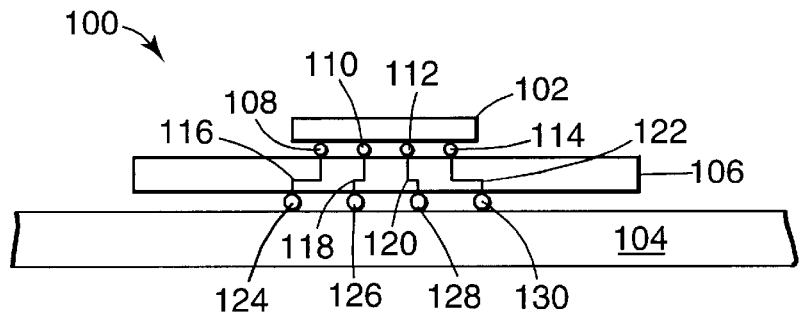
FIG. 1 is a sectional view illustrating a prior art interconnection between an integrated circuit and a printed circuit board.

FIG. 1 is a sectional view of system 100 illustrating the interconnections between integrated circuit 102 and printed circuit board 104 via package 106. Integrated circuit 102 includes die pins 108, 110, 112, and 114 capable of providing an electrical connection with corresponding receptacles within package 106. The corresponding receptacles within package 106 are not shown for clarity purposes. However, it is understood in the art that die pins 108–114 can be received by the corresponding receptacles, thereby ensuring both a mechanical and an electrical connection. Package 106 also includes wires or electrical connectors 116, 118, 120, and 122 which interconnect die pins 108, 110, 112, and 114 to printed circuit board pins 124, 126, 128, and 130, respectively. As is known in the art, printed circuit board pins 124, 126, 128, and 130 can be inserted into corresponding receptacles within printed circuit board 104 (not shown for clarity purposes) in order to create a mechanical and an electrical connection. It is understood by those in the semiconductor field that the number of die pins, printed circuit board pins, and corresponding receptacles may vary depending on the particular application. It is also understood that the overall configuration and size of various elements throughout the figures of this document are exaggerated for clarity purposes.

FIG. 1 illustrates a prior art interconnection between an output signal of integrated circuit 102 to printed circuit board 104. Prior to a signal exiting integrated circuit 102 via one of die pins 108, 110, 112, and 114, the signal enters a driver (not shown in FIG. 1). The output of the driver is connected to one of die pins 108, 110, 112, and 114. A driver is a known circuit element consisting of a transistor design which performs a function on a signal. In most instances, a driver amplifies an input signal to produce an amplified output signal. The driver signal is transmitted to printed circuit board 104 via the associated electrical connector and printed circuit board pin. The driver signal is then transmitted to one or more loads, such as an electrical component or another integrated circuit connected to printed circuit board 104 via conductive traces within printed circuit board 104 (not shown in FIG. 1). More specifically, in one design of the prior art system, a driver signal outputted from a die pin of integrated circuit 102 and its associated driver is transmitted to a single load, such as an electronic component or another integrated circuit, located on printed circuit board 104. Another embodiment of the prior art system utilizes a fanout design which provides multiple paths from a single die pin to numerous electrical components or integrated circuits located on printed circuit board 104. In this configuration, a single driver signal from integrated circuit 102 is responsible for driving various electronic components or integrated circuits of the overall system.

The overall speed and frequency of digital electronic circuits and computers are constantly increasing. With the increasing speed, it has become difficult to provide an integrated circuit having drivers capable of driving signals to one or more loads at elevated frequencies. While a single signal may eventually provide an adequate signal to drive a desired load, such as an electronic component or integrated circuit, the time necessary to properly drive the load is inhibiting to the overall function of the system. In addition, due to the increased number of integrated circuits and other electronic components which can be included on a single printed circuit board, the number of printed circuit board pins, such as printed circuit board pins 124, 126, 128, and 130, is insufficient for interconnection.

Figure 2:
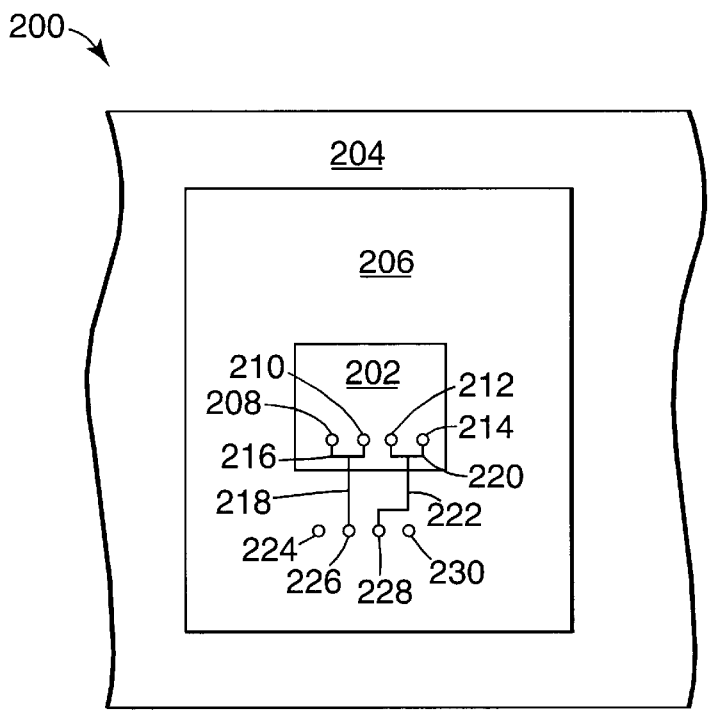
FIG. 2 is a top view of integrated circuit illustrating the connection pattern of the present invention.
Figure 3:
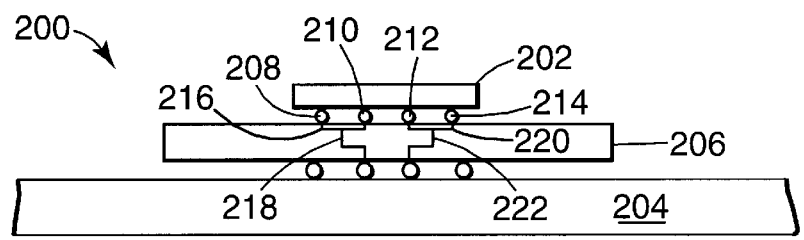
FIG. 3 is a sectional view of the integrated circuit shown in FIG. 2.

FIG. 2 is a top view of system 200, while FIG. 3 is a sectional view of system 200. System 200 illustrates the present invention and includes integrated circuit 202, printed circuit board 204, and package 206. Package 206 provides protection for fragile, silicon integrated circuit 202 and provides a connection between integrated circuit 202 and printed circuit board 204. Printed circuit board 204 facilitates interconnection between integrated circuit 202 and other integrated circuits or electrical components within system 200 through board traces, conducting wires, or other electrical connections.

Integrated circuit 202 includes numerous drivers, not shown in FIGS. 2 and 3 for clarity purposes. A driver is a well-known electrical component within integrated circuit technology. A driver is an electronic component which receives a signal from within integrated circuit 202 and provides an output signal via an associated die pin, such as one of die pins 208, 210, 212, and 214, to other integrated circuits or electronic components of system 200. In one embodiment, each driver within integrated circuit 202 is fabricated utilizing numerous transistors and provides the function of amplifying the input signal to provide an amplified output signal.

In order to both increase signal strength driven to a load, such as an integrated circuit or electronic component, and to minimize the number of printed circuit board pins, such as pins 224, 226, 228, and 230, the interconnection design shown in FIGS. 2 and 3 can be utilized. As shown in FIGS. 2 and 3, the outputs at die pins 208 and 210 are immediately electrically coupled via electrical connector 216. The single combined signal can then be transmitted to board pin 226 via electrical connector 218. A similar design is shown for the outputs of died pins 212 and 214, utilizing electrical connectors 220 and 222 and printed circuit board pin 228. In one embodiment, electrical connectors 216, 218, 220, and 222 are electrically conducting wires, such as a copper composite wire.

The interconnection design shown in FIGS. 2 and 3, as compared to the prior art design shown in FIG. 1, utilizes 50% fewer printed circuit board pins. The goal of reducing the overall number of used printed circuit board pins within a specific design is achieved. More specifically, printed circuit board pins 224 and 230 are no longer used to drive signals. Thus, printed circuit board pins 224 and 230 may be used for other interconnection needs within the overall system.

The location of electrical connectors 216 and 220 impacts the overall signal strength of a driver signal provided to a load via die pins 208, 210, 212, and 214. It is an object of the present invention to interconnect the outputs of the driver associated with die pins 208, 210, 212, and 214 as close to die pins 208, 210, 212, and 214 to minimize the length of electrical connectors 216 and 220.

As is known in the art, electrical connectors, such as electrical connectors 216 and 220, have an impedance associated with them. A long wire includes a large impedance as compared to a shorter wire having a smaller impedance. Thus, it is important to interconnect the outputs of die pins 208, 210, 212, and 214 as close to the pins as possible. A minimal wire distance between the die pin and the interconnection point will prevent signal mismatch transmitted onto electrical connectors 218 and 222. Single mismatch may be detrimental to the overall functionality of system 200. In addition, if a driver signal transmitted from die pin 208 to the interconnection of electrical connector 218, it will attempt to travel down a path of least resistance. Thus, by physically eliminating the path to die pin 210, all of the signal from die pin 208 will propagate down wire 218 to printed circuit board pin 226. A similar discussion applies to driver signals from die pins 210, 212, and 214. Thus, a combined driver signal is propagated or transmitted to a load, the combined signal having twice as much strength as a non-combined signal (assuming the two original signals from die pins 208 and 210 or die pins 212 and 214 are equal in strength to each other).

While it is understood that the combined signal from either die pins 208 and 210 or die pins 212 and 214 will propagate down wires 218 and 222, respectively, at the same speed as would a single, non-combined signal, the combined signal is double in strength as compared to a single signal. Thus, once the combined signal reaches its destination, such as another integrated circuit or electrical component, the combined signal is capable of driving the integrated circuit or electrical component (load) at a faster rate than that of a single signal. Therefore, the present design achieves the goal of increasing a drive signal from integrated circuit 206 to a load.

Figure 4:
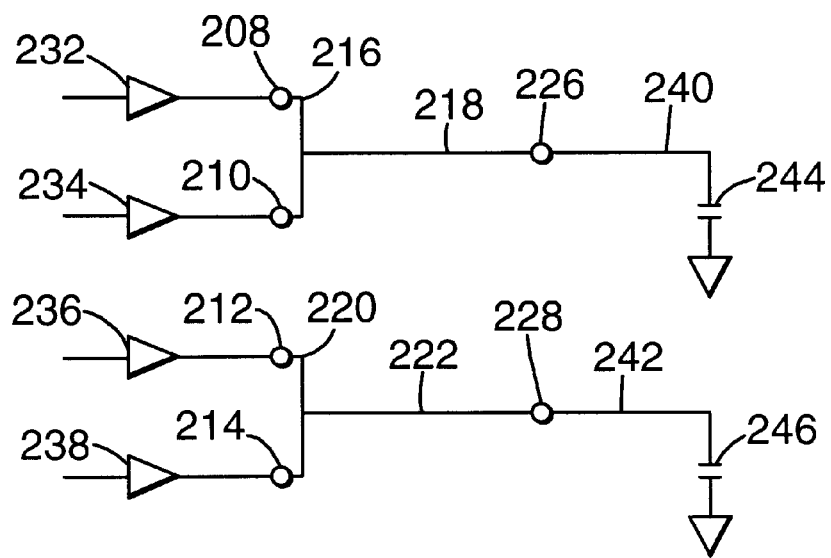
FIG. 4 is an electrical diagram illustrating the connection pattern of the present invention.

FIG. 4 is an electrical diagram illustrating the connection pattern of the present invention. While a power source is not shown, it is understood that each driver is powered by a power source supplied to the integrated circuit to which all drivers are connected. FIG. 4 includes drivers 232, 234, 236, and 238, die pins 208, 210, 212, and 214, electrical connectors 216, 218, 220, and 222, printed circuit board pins 226 and 228, electrical traces 240 and 242, and capacitors 244 and 246. As shown in FIG. 4, drivers 232, 234, 236, and 238 each receive an input signal to be driven to other parts of the overall system. The outputs of die pins 208 and 210 are immediately interconnected via electrical connector 216, while the outputs of die pins 212 and 214 are immediately connected via electrical connector 220. Electrical connectors 218 and 222 electrically connect the combined driver signals to printed circuit board pins 226 and 228, respectively. Conductive traces 240 and 242, which are electrically conducting traces fabricated in printed circuit board 204, electrically connect the combined driver signals to capacitors 244 and 246, respectively. Capacitors 240 and 242 represent loads, such as integrated circuits or electrical components, residing on printed circuit board 204.

Figure 5:
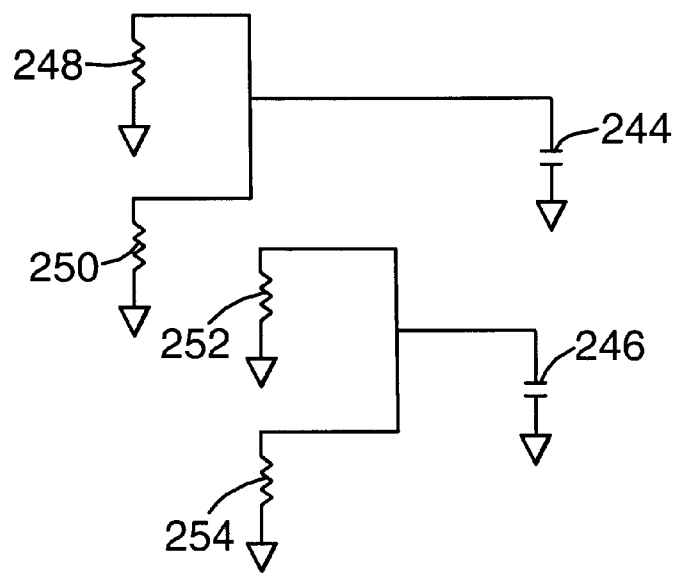
FIG. 5 is an electrical diagram illustrating an electrical representation of the present invention.

FIG. 5 is an electrical representation of the connection pattern shown in FIG. 4. In FIG. 5, drivers 232, 234, 236, and 238 have been replaced by resistors 248, 250, 252, and 254. It is known to those in the art that the sum of two parallel resistances is a resistance having a value less than the resistance of either of the parallel resistances. With the resistance on wires 218 and 222 being less than the resistance of resistors 248, 250, 252, and 254, additional current equating to a greater driver signal will propagate to loads 244 and 246, respectively. As an example, if resistors 248 and 250 are of equal value, the overall resistance is equal to one-half the value of either resistor 248 or 250. Thus, a driver signal having twice the intensity is transmitted to load 244. Therefore, FIG. 5 illustrates that by connecting two parallel drivers, an increased drive signal can be transmitted to a desired load.

Figure 6:
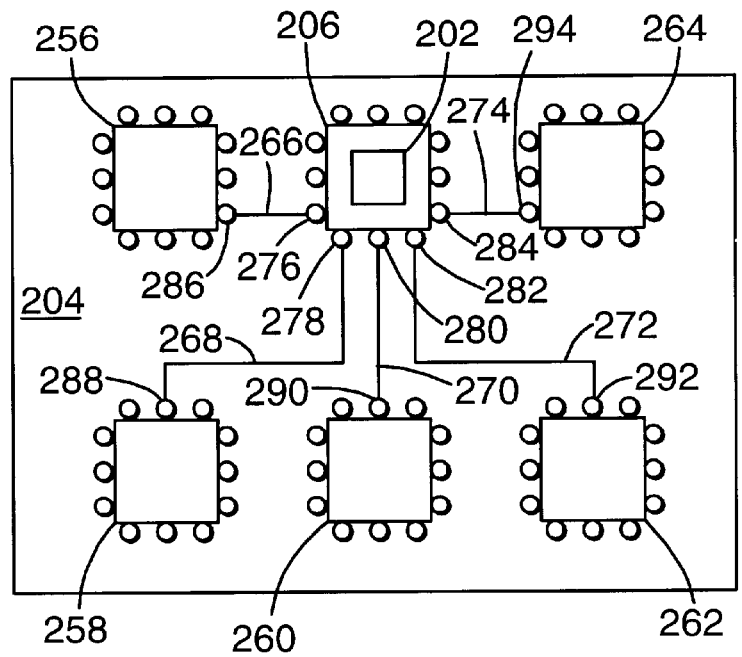
FIG. 6 is a top view illustrating one embodiment of a printed circuit board of the present invention.
Figure 7:
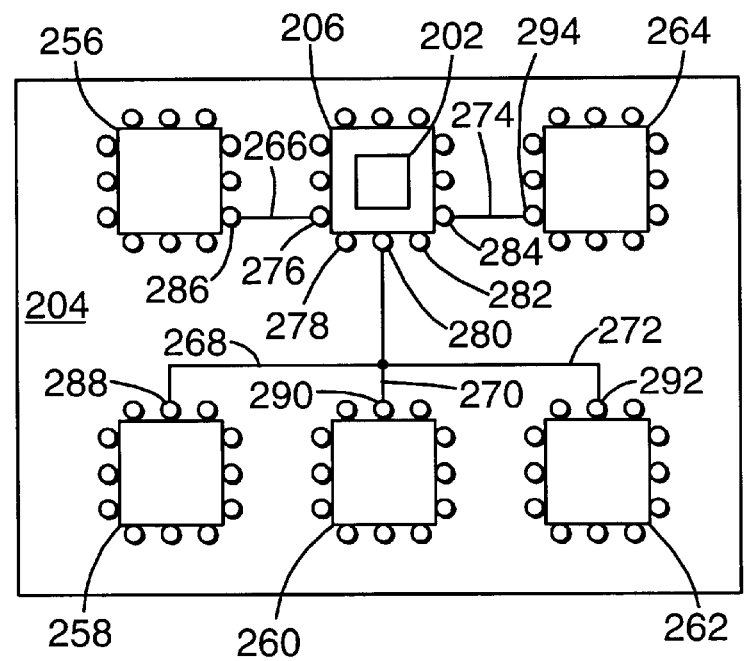
FIG. 7 is a top view illustrating another embodiment of a printed circuit board of the present invention.

FIG. 6 is a top view illustrating one embodiment of a printed circuit board of the present invention. FIG. 7 is a top view illustrating another embodiment of a printed circuit board of the present invention. The connections between integrated circuit 202 and printed circuit board 204 are not shown in FIGS. 6 and 7 for clarity purposes. As shown in FIGS. 6 and 7, package 206 may be interconnected to other integrated circuits, such as packages 256, 258, 260, 262, and 264 via electrical traces 266, 268, 270, 272, and 274, respectively. Electrical traces 266, 268, 270, 272, and 274 electrically connect printed circuit board pins 276, 278, 280, 282, and 284 associated with package 206 to printed circuit board pins 286, 288, 290, 292, and 294 of packages 256, 258, 260, 262, and 264, respectively. However, it is understood that within package 206, the output of two or more drivers have been interconnected in accordance with the present invention such that an increased driver signal is propagated between packages.

As shown in FIG. 6, each output of package 206 is connected to a single input of another package. Conversely, as shown in FIG. 7, printed circuit board pin 280 of package 206 is provided to three adjacent packages located proximal to each other (packages 258, 260, and 262). The configuration shown in FIG. 7 can be utilized when a combined signal is driving multiple integrated circuits or electronic components located proximal to each other. FIG. 7 illustrates a fanout design which provides multiple paths from a single combined drive signal to numerous components or integrated circuits. Thus, single driver signal having increased strength is utilized.

The present invention provides a combined driver signal to a load of a system by electrically coupling the outputs of two or more drivers of an integrated circuit, thereby producing an increased driver signal to the load. While any one combined driver signal is not propagated between integrated circuits or electrical components at a faster rate than as previously known, multiple signals are transmitted to the load in the same amount of time necessary for a single signal previously reached the load. In addition, the printed circuit board pin count for the associated printed circuit board is decreased since two or more driver signals are supplied to a single printed circuit board pin.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A system comprising:
    an integrated circuit including:
        a first die pin and a second die pin;
        a first driver for receiving a first input signal at an input and for outputting a first output signal to the first die pin; and
        a second driver for receiving a second input signal at an input and for outputting a second output signal to the second die pin;
    a circuit board having an electrical conductor; and
    a package providing protection for the integrated circuit and including:
        an electrically coupling device connecting the first die pin to the second die pin, thereby adapted to combine the first output signal and the second output signal to produce a combined driver signal; and
        an electrical connector coupled to the electrically coupling device and the electrical conductor of the circuit board, thereby adapted to provide the combined driver signal to the electrical conductor.

2. The system of claim 1 wherein the electrically coupling device further comprises an electrically conducting wire.

3. The system of claim 1 wherein the electrically coupling device connects the first die pin and the second die pin such that a distance between the first die pin and an interconnection point is minimized and such that a distance between the second die pin and the interconnection point is minimized.

4. A system for driving a plurality of loads, the system comprising:
    an integrated circuit including:
        2N die pins; and
        2N drivers for receiving 2N input signals and for outputting 2N output signals to the 2N pins;
    a circuit board having N electrical conductors, each coupled to at least one the plurality of loads; and
    a package providing protection for the integrated circuit and including:
        N electrically coupling devices, each electrically coupling device connecting two of the 2N die pins, thereby adapted to combine two of the 2N output signals to produce a combined driver signal, wherein the N electrically coupling devices are adapted to produce N combined driver signals; and
        N electrical connectors, each coupled to one of the N electrically coupling devices and one of the N electrical conductors of the circuit board and thereby adapted to provide the N combined driver signals to the N electrical conductors.

5. The system of claim 4 wherein each of the N electrically coupling devices further comprises an electrically conducting wire.

6. The system of claim 4 wherein each of the N electrically coupling devices connects two of the N die pins such that a distance between a first of the two of the N die pins to and an interconnection point is minimized and such that a distance between a second of the two of the N die pins and the interconnection point is minimized.

7. A method of driving a load, the method comprising:
    driving a first signal in an integrated circuit, thereby producing a first driver signal at a first die pin of the integrated circuit;
    driving a second signal in the integrated circuit, thereby producing a second driver signal at a second die pin of the integrated circuit;
    electrically coupling, in a package, the first and second driver signals at the first and second die pins thereby producing a combined driver signal;
    electrically connecting, in the package, the combined driver signal to an electrical conductor in a circuit board; and
    providing the combined driver signal to the load via the electrical conductor in the circuit board.

8. The method of claim 7 and further comprising:
    minimizing a distance between the first die pin of the integrated circuit and an interconnection point; and
    minimizing a distance between the second die pin of the integrated circuit and an output of the second driver and the interconnection point.

9. A method of producing a combined driver signal, the method comprising:
    driving at least two signals in an integrated circuit, thereby producing at least two driver signals at least two die pins of the integrated circuit; and
    electrically coupling, in a package, at least two driver signals at least two die pins of the integrated circuit, thereby producing the combined driver signal.

10. The method of claim 9, and further comprising:
    minimizing a distance between a first die pin of the integrated circuit and an interconnection point; and
    minimizing a distance between a second die pin of the integrated circuit and the interconnection point.

11. A package providing protection for an integrated circuit having a first die pin, a second die pin, a first driver for providing a first driver signal to the first die pin, and a second driver for providing a second driver signal to the second die pin, wherein the package provides interconnection between the integrated circuit and a circuit board having an electrical conductor, the package comprising:
    an electrically coupling device connecting the first die pin to the second die pin, thereby adapted to combine the first driver signal and the second driver signal to produce a combined driver signal; and
    an electrical connector coupled to the electrically coupling device and the electrical conductor of the circuit board, thereby adapted to provide the combined driver signal to the electrical conductor.

12. The package of claim 11 wherein the electrically coupling device further comprises an electrically conducting wire.

13. The package of claim 11 wherein the electrically coupling device connects the first die pin and the second die pin such that a distance between the first die pin and an interconnection point is minimized and such that a distance between the second die pin and the interconnection point is minimized.

* * * * *